(12) United States Patent
Sun et al.

(10) Patent No.: US 11,401,600 B1
(45) Date of Patent: Aug. 2, 2022

(54) VARIABLE-TEMPERATURE AND FAST-SINTERING PROCESS OF ALUMINUM-DOPED ZINC OXIDE TARGET MATERIAL

(71) Applicant: Zhengzhou university, Zhengzhou (CN)

(72) Inventors: Benshuang Sun, Shizuishan (CN); Yang Liu, Zhengzhou (CN); Jilin He, Shizuishan (CN); Xueyun Zeng, Huangchuan County (CN); Yongchun Shu, Huangchuan County (CN); Jie Chen, Zhengzhou (CN); Zhenhua Hao, Zhengzhou (CN)

(73) Assignee: ZHENGZHOU UNIVERSITY, Zhengzhou (CN)

( * ) Notice: Subject to any disclaimer, the term of this patent is extended or adjusted under 35 U.S.C. 154(b) by 0 days.

(21) Appl. No.: 17/488,512

(22) Filed: Sep. 29, 2021

(30) Foreign Application Priority Data

Jul. 14, 2021 (CN) .......................... 202110795568.7

(51) Int. Cl.
 *C04B 35/64* (2006.01)
 *C23C 14/34* (2006.01)
 (Continued)

(52) U.S. Cl.
 CPC ........ *C23C 14/3414* (2013.01); *C04B 35/453* (2013.01); *C04B 35/6264* (2013.01);
 (Continued)

(58) Field of Classification Search
 CPC .............. C04B 35/453; C04B 35/6264; C04B 35/62655; C04B 35/638; C04B 35/64;
 (Continued)

(56) References Cited

U.S. PATENT DOCUMENTS

| | | | |
|---|---|---|---|
| 8,389,135 B2* | 3/2013 | Nakayama | ............ C23C 14/086 428/701 |
| 9,824,869 B2* | 11/2017 | Yoshikawa | ......... H01J 37/3423 |
| 2011/0284364 A1* | 11/2011 | Margadant | ............. B82Y 30/00 204/192.15 |

FOREIGN PATENT DOCUMENTS

| | | | |
|---|---|---|---|
| CN | 102212781 A | 10/2011 | |
| CN | 108706965 A | 10/2018 | |
| JP | 4092764 B2 * | 5/2008 | ........... C04B 35/453 |

OTHER PUBLICATIONS

Zhiyong Wang, Preparation of zinc oxide (AZO) powder and ceramic target, Full text database of Chinese Excellent Doctoral and master's Dissertations (Master's) information technology series,2014, issue 05, p. 14, p. 18-19 and p. 36-51.

* cited by examiner

*Primary Examiner* — Noah S Wiese
(74) *Attorney, Agent, or Firm* — WPAT, PC

(57) ABSTRACT

A variable-temperature and fast-sintering process for an alumina-doped zinc oxide target material is provided. Integrated degreasing and sintering processes are carried out on an alumina-doped zinc oxide biscuit, The degreasing process is carried out in air atmosphere, and a high-density alumina-doped zinc oxide target material is produced by a variable-temperature treatment during the sintering process under a state of circulating controllable mixed atmosphere. The mixed atmosphere is air and oxygen. As a result, a sintering time is greatly reduced, so that a fast-activated sintering is realized to inhibit grain growth.

9 Claims, 3 Drawing Sheets

(51) Int. Cl.
    *C23C 14/08*         (2006.01)
    *C04B 35/453*      (2006.01)
    *C04B 35/638*      (2006.01)
    *C04B 35/626*      (2006.01)

(52) U.S. Cl.
    CPC ...... *C04B 35/62655* (2013.01); *C04B 35/638* (2013.01); *C04B 35/64* (2013.01); *C23C 14/081* (2013.01); *C23C 14/086* (2013.01); *C04B 2235/3217* (2013.01); *C04B 2235/3284* (2013.01); *C04B 2235/606* (2013.01); *C04B 2235/6022* (2013.01); *C04B 2235/6562* (2013.01); *C04B 2235/6565* (2013.01); *C04B 2235/6567* (2013.01); *C04B 2235/6585* (2013.01)

(58) Field of Classification Search
    CPC .... C04B 2235/3217; C04B 2235/3284; C04B 2235/6022; C04B 2235/606; C04B 2235/6567; C04B 2235/6585
    See application file for complete search history.

VARIABLE-TEMPERATURE AND FAST-SINTERING PROCESS OF ALUMINUM-DOPED ZINC OXIDE TARGET MATERIAL

TECHNICAL FIELD

The invention relates to the technical field of metal oxide target materials, especially to a variable-temperature and fast-sintering process of an aluminum-doped zinc oxide target material.

BACKGROUND

AZO (Al-doped in ZnO) is an aluminum-doped zinc oxide ceramic, also known as zinc oxide aluminum, which is an important transparent conductive electrode material, as well as an important gas sensitive material and catalyst or catalyst carrier material. The transparent conductive film made of AZO has the advantages of high conductivity, high transmittance in visible light region, high reflectivity in infrared region, high ultraviolet absorption rate, etc. It is rich in raw material resources, nontoxic and harmless, and low in cost, and can be widely used in the fields of optoelectronic devices such as solar cell electrodes, liquid crystal displays and plasma displays. It may be used as a substitute for ITO thin film, and has a wide application prospect in flat panel display, solar cell, energy-saving glass, smart glass and other fields.

AZO ceramics are important target materials for preparing AZO thin films. In order to prepare high-density (relative density over 99%) or even ultra-high-density (relative density over 99.5%) targets, usually, cold pressing, dry pressing or wet forming processes are adopted. And ceramic biscuit with a certain size is prepared by drying and curing, and then the biscuit is heated and degreased, and sintered under pressure or normal pressure according to a certain temperature curve, so as to obtain AZO target products after processing.

Domestic manufacturers mainly use molding pressing method plus isostatic pressing method to prepare oxide target, but the limitation of the method is large, and the product is difficult to meet the requirements of the high-end market. However, the combination of slurry casting and atmosphere sintering technology is a rising preparation method of oxide target. The slurry casting technology has the advantages of simple equipment, low production cost and continuous operation. It is a material curing process suitable for obtaining high biscuit density and uniform microstructure.

The sintering methods of AZO target usually include normal pressure solid phase sintering, hot pressing sintering, microwave sintering, hot isostatic pressing sintering and spark plasma sintering. However, from the perspective of practical industrial application, the current popular process is mainly oxygen atmosphere sintering method, especially low pressure or atmospheric pressure oxygen atmosphere sintering process has been successfully developed by many companies, such as Chinese patent publication numbers CN101575207A, CN101580384A, CN106747403A, CN107522483A, CN107176840A, CN107010939A and CN102586736A and other public pressing molding, atmospheric pressure (low pressure) sintering methods, Chinese patent publication numbers CN107032781A, CN102942363A, CN102351526A, CN106431387A, CN102924076A and CN102212781A and other public grouting molding, degreasing, sintering methods. Atmospheric pressure sintering process has many advantages, such as simple process, easy operation, avoiding the risk of high pressure oxygen, and can prepare target products with large size and high relative density. However, most of the processes developed by these companies adopt the process route of heating debinding and sintering, respectively. After debinding, the biscuit must be cooled to room temperature to move to the sintering furnace, so as to re-heat and sinter.

Due to the limited strength of the target biscuit formed by grouting or cold pressing after being heated and degreased, cracks and even fractures will occur if it vibrates slightly. Once such defects appear, it is difficult to eliminate them by sintering, which will eventually become a quality problem in the target product. In addition, the so-called normal pressure (equal to 1 kg/cm$^2$ pressure) oxygen atmosphere sintering process in the prior art, whose oxygen flow rate is usually over 30 L/min, is not a true pressureless sintering process. According to sintering theory, the sintering of ZnO and Al$_2$O$_3$ is usually carried out at $\frac{2}{3}$-$\frac{4}{5}$ of its melting point, that is, above 1300° C., and the holding time is as long as 12 hours. With the addition of separate degreasing time, heating and cooling time, the whole process takes more than 8 days or even 10 days, resulting in serious waste of power, oxygen and manpower, which eventually leads to high product cost. Meanwhile, sintering at high temperature for a long time leads to serious grain growth and uneven distribution.

SUMMARY

An objective of the invention is to provide a variable-temperature and fast-sintering process for an aluminum-doped zinc oxide target material, which may include the following steps: heating for degreasing a biscuit in an air atmosphere; and then, under the action of variable-temperature sintering at high and low temperatures, realizing an atmosphere auxiliary condition of mainly circulating air and adding a proper amount of oxygen, and the oxygen concentration is independently controllable, thereby realizing an effective control of microstructures of a final product in a densification process.

To obtain high-quality thin films, it is necessary to prepare high-quality target materials first. In the process of sputtering target production, pulverizing, forming and sintering are three important links, and the performance of the target will directly affect the quality of coating. The invention is mainly to solve problems of the three links.

In order to achieve the above objective or other objective, the invention provides the following scheme:

Specifically, the invention provides a variable-temperature and fast-sintering process for an aluminum-doped zinc oxide target, including: carrying out integrated degreasing and sintering processes on an aluminum-doped zinc oxide biscuit. The degreasing process is carried out in air atmosphere, and a high density aluminum-doped zinc oxide (AZO) target material is prepared by a variable-temperature treatment (also referred to temperature-changing treatment) in the sintering process under circulating controllable mixed atmosphere. The mixed atmosphere is air (20%-40%) and oxygen (60%-80%). Furthermore, a flow rate of the mixed atmosphere is 8-16 L/min.

In an embodiment, the sintering process is carried out under atmospheric pressure.

The invention discloses a variable-temperature and fast-sintering process of an aluminum-doped zinc oxide target material, which includes the following steps: directly placing an aluminum zinc oxide biscuit in a sintering furnace, heating and preserving heat according to a degreasing temperature curve in an air atmosphere, then introducing a certain amount of oxygen, switching the sintering furnace into an air+oxygen mode, and sintering, annealing and cooling according to a predetermined sintering curve. The whole degreasing and sintering processes do not need to be cooled and then heated again, and two procedures of degreasing and sintering are completed at one time in a continuous heat treatment mode, thereby greatly shortening the production cycle and improving the production efficiency.

In an embodiment, the degreasing process includes heating to 400-600° C. at a heating rate of 15-25° C./h and keeping the temperature constant for 2-8 h to degrease the biscuit.

In an embodiment, a process of the variable-temperature treatment includes the following steps: after the degreasing, introducing oxygen, heating to 1000-1100° C., and keeping the temperature for 1-5 h; then according to a preset sintering temperature curve, rapidly heating to a highest sintering temperature $T_1$, keeping the temperature for a short time, then cooling to a relatively lower temperature $T_2$, keeping the temperature at $T_2$ for a certain time, stopping oxygen supply, and cooling to thereby obtain the high-density aluminum-doped zinc oxide target material.

In an embodiment, a heating rate of the rapid heating process is 50-150° C./h, if the heating rate is lower than 50° C./h, the biscuit cannot obtain a corresponding sintering driving force, and if the heating rate is higher than 150° C./h, the biscuit's yield rate will be too high, resulting in target cracking. The highest sintering temperature $T_1$ is 1400-1500° C., the short-time holding time is 1-2 h, the lower temperature $T_2$ is 1200-1300° C., and the temperature is kept at $T_2$ for 2-8 h, and the cooling process is to first cool to 200° C. at a rate of 25-50° C./h, which can effectively avoid defects such as cracks in the target material during the cooling process, and then naturally cool to room temperature.

In an embodiment, a flow rate of the oxygen is 1-5 L/min, and the atmosphere flow rate higher than 5 L/min will lead to unbalanced distribution of temperature field in the furnace, inconsistent shrinkage in the sintering process, and cracking of the target material during sintering.

In an embodiment, the aluminum-doped zinc oxide biscuit is prepared by a grouting method, which specifically includes the following steps:

(1) mixing zinc oxide powder and alumina powder to obtain mixed powder;

(2) adding deionized water, a molding agent, a dispersant and a defoamer into the mixed powder and mixing evenly, and performing high-energy ball milling to prepare mixed slurry; and (3) injecting the mixed slurry into a mold for forming, standing, demoulding and drying to thereby prepare the aluminum-doped zinc oxide biscuit.

In an embodiment, during the preparation of aluminum-doped zinc oxide biscuit, a solid content of mixed powder in the mixed slurry is set between 50%-80%, a slurry viscosity is set between 120-3800 MPa·s, and a pH value is 7-9.

In an embodiment, in the preparation process of aluminum-doped zinc oxide biscuit, the alumina powder accounts for 2-5 wt % of a total mass of zinc oxide powder and alumina powder.

In an embodiment, in the preparation process of aluminum-doped zinc oxide biscuit, a grouting pressure of slurry casting molding is 0.1-0.4 MPa, and a grouting pressure maintaining time is 5-20 hours.

In an embodiment, a relative density of the aluminum-doped zinc oxide biscuit of the invention is 58%-72%.

In an embodiment, after mixing the zinc oxide powder and the alumina powder, a pretreatment process of the zinc oxide powder and the alumina powder is also included.

In an embodiment, in the pretreatment process, the mixed powder is pretreated by adopting an airflow crushing method, and an airflow impact pressure is 1-4 MPa.

In an embodiment, a rotation speed in the high-energy ball milling process is 1400-3200 r/min, a ball-to-material ratio is 10:1-2:1, a size of a milling ball is 0.3-1.6 mm, and a mixing time of ball milling is 0.5-1.5 h.

The invention may achieve the following technical effects:

The variable-temperature and fast sintering process of an aluminum-doped zinc oxide target material disclosed by the invention adopts the integrated degreasing-sintering processes. Compared with the existing method, the sintering time is greatly shortened, and the whole sintering process from degreasing-sintering to cooling can be completed in only 4 days. Rapid activation sintering is realized to inhibit grain growth. The sintered AZO target has fine and uniform grains, an average grain size of 4-6 μm, high density, and a relative density of more than 99.8%. It has high strength performance, bending strength ≥250 Mpa, and relatively lower resistivity which can reach $2.70 \times 10^{-3}$ Ω·cm.

In order to more clearly explain embodiments of the invention or the technical solutions in the prior art, the following will briefly introduce the drawings to be used in the embodiments. It is apparent that the drawings described below are only some embodiments of the invention. For those skilled in the art, without paying creative labor, other drawings can also be obtained from these drawings.

DETAILED DESCRIPTION OF THE EMBODIMENTS

Figure 1:
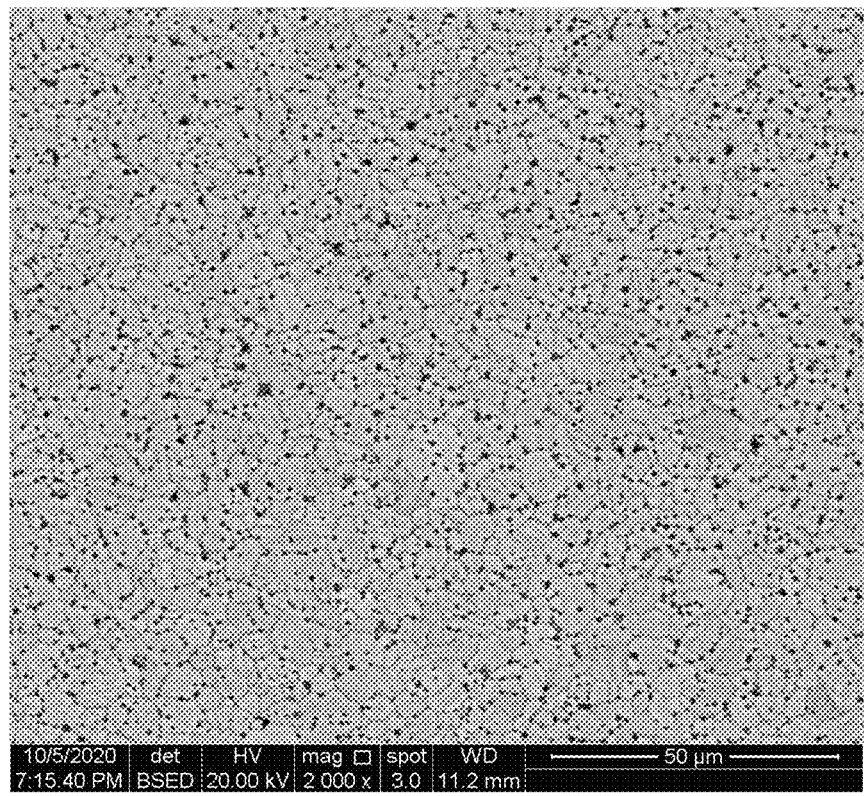
FIG. 1 is a SEM image of grain morphology of an aluminum-doped zinc oxide target (AZO target) prepared in embodiment 1.

Now, various exemplary embodiments of the invention will be described in detail. This detailed description should not be regarded as a limitation of the invention, but should be understood as a more detailed description of certain aspects, characteristics and embodiments of the invention.

It should be understood that the terms described in the invention are only for describing specific embodiments, and are not intended to limit the invention. In addition, as for the numerical range in the invention, it should be understood that every intermediate value between the upper limit and the lower limit of the range is also specifically disclosed. Intermediate values within any stated value or stated range and every smaller range between any other stated value or intermediate values within the stated range are also included in the invention. The upper and lower limits of these smaller ranges can be independently included or excluded from the range.

Unless otherwise stated, all technical and scientific terms used herein have the same meanings as commonly understood by those skilled in the art to which this invention relates. Although the invention only describes preferred methods and materials, any methods and materials similar or equivalent to those described herein may be used in the practice or testing of the invention. All documents mentioned in this specification are incorporated by references to disclose and describe methods and/or materials related to the documents. In case of conflict with any incorporated documents, the contents of this specification shall prevail.

Without departing from the scope or spirit of the invention, it is obvious to those skilled in the art that many modifications and changes can be made to the specific embodiments of the specification of the invention. Other embodiments derived from the description of the invention will be apparent to the skilled person. The description and embodiments of the invention are merely exemplary.

As used herein, "including", "comprising", "having", "containing", etc. are all open terms, which means including but not limited to.

The solid phase mentioned in the invention generally refers to powder components in the mixed slurry, that is, mixed powder, including zinc oxide powder and aluminum oxide powder.

In a variable-temperature fast-sintering process (also referred to variable-temperature sintering process) of an aluminum-doped zinc oxide target material disclosed by the invention, the sintering process may be carried out according to the following steps:

S1. mixing zinc oxide powder and aluminum oxide powder to obtain mixed powder;

S2. carrying out airflow impact crushing on the mixed powder, the airflow impact pressure being 1-4 MPa, and obtaining the powder with optimized particle shape and uniform mixing;

S3. placing the mixed powder in a high-energy ball mill, adding water, a forming agent, a dispersant and a defoaming agent to obtain mixed slurry, in which a rotating speed is 1400-3200 r/min, a ball-to-material ratio is 10:1-2:1, a size of milling ball is 0.3-1.6 mm, and ball milling and mixing for 0.5-1.5 h;

S4. pouring and molding the mixed slurry in a grouting way, standing, demoulding and drying to thereby obtain an aluminum-doped zinc oxide biscuit;

S5. carrying out integrated degreasing-sintering on the aluminum-doped zinc oxide biscuit to obtain the aluminum-doped zinc oxide target material.

In some embodiments, the raw materials of zinc oxide powder and aluminum oxide powder used in the invention are ordinary commercial products, that is, products prepared by any one of chemical precipitation method, electrolysis method, hydrothermal synthesis method and physical evaporation method can be used. Usually, the morphology of zinc oxide powder and alumina powder is not limited, that is, the morphology of the powder can be angular, spherical, flaky or blocky, rod-like, etc.

In some embodiments, zinc oxide powder and alumina powder are ground and mixed using airflow impact grinding plus high-energy ball milling. Airflow crushing under the action of hedging high-pressure air can achieve rapid crushing of agglomerated particles, and the particle size can quickly reach about 1 micron, while forming particles with good shape (polygonal, lumpy, etc.), suitable for further crushing in the subsequent high-energy ball milling process. High-energy ball milling and conventional ball milling method has the advantages of short grinding time and less introduction of impurities. In the high-speed rotating ball mill, the violent collision effect of rod pin, ceramic ball and powder makes the powder particles be broken quickly, and the average particle size of powder can be reduced to less than 500 nm within 0.5-1.5 h, while the traditional ball milling time needs more than 48 h.

When mixing, add grinding/milling balls and pure water, and the ball-to-material ratio is 10:1-2:1; The mass ratio of large balls to small balls is 3:1-2:1. The diameters of large and small balls are 3-10 mm and 0.5-1.6 mm, respectively.

In some embodiments, when preparing slurry, the molding agent added to the mixed powder is polyvinyl alcohol, and its addition amount is 1%-2% of the mixed slurry; the dispersant added is ammonium polyacrylate, whose addition amount is 0.1%-0.2% of the mixed slurry; and the defoamer added is polyether, whose addition amount is 0.1%-0.2% of the mixed slurry.

In some embodiments, the solid content of the mixed powder in the mixed slurry is 50%-80%.

Usually, the parameters of slurry pouring process, such as solid content, slurry viscosity, grouting pressure, etc., have an major impact on the forming and final relative density of biscuit compact. Generally speaking, high solid content is beneficial to obtain high biscuit density and reduce various sintering defects caused by excessive deformation in the subsequent sintering process, such as warpage, fracture, low density and large machining allowance. However, if the solid content is too high, the control of slurry viscosity will be affected, and if the slurry viscosity is too high or too low, the formability will be deteriorated. As a preferred embodiment, the invention selects relatively moderate solid content and viscosity value. In addition, the higher the grouting pressure, the faster and more uniform grouting can be achieved, and the uneven density caused by local rapid solidification can be reduced. However, the bearing capacity of gypsum mold is limited, and generally it can only bear the ultimate pressure of 6 kg/cm$^2$.

In a preferred embodiment, the solid content of the slurry is controlled between 50% and 80%, and in a more preferred embodiment, the solid content of the slurry is controlled between 60% and 70%.

As a preferred embodiment, the slurry viscosity is controlled between 120 and 3800 mPa·s. in a more preferred embodiment, the slurry viscosity is controlled between 200-1000 mPa·s. in a further preferred embodiment, the slurry viscosity is controlled between 300-700 mPa·s, and can also be preferably between 400-600 mPa·s.

As a preferred embodiment, the pH value of the slurry is set between 7-9, or any value in the interval, such as 7.4, 7.6, 7.8, 8.0, 8.2, 8.4, etc.

In some embodiments, the grouting molding adopts the pressure grouting method, and the grouting pump is directly injected into the cavity of the gypsum mold for molding. After standing for a period of time, the mold is removed to obtain the zinc aluminum oxide biscuit, and then the biscuit is placed in a constant temperature and humidity box for drying.

As a preferred embodiment, the grouting pressure for slurry pouring is set between 0.1-0.4 MPa, preferably between 0.2-0.3 MPa.

As a preferred embodiment, the grouting pressure maintaining time is set between 5-20 h, more preferably between 6-10 h.

In some embodiments, the biscuits produced by teeming are placed neatly on a trolley, and the trolley is pushed into a sintering furnace, so that they can be degreased and sintered. Debinding sintering is the key process to prepare high-quality AZO target, and the parameters of each section of the process curve are very important, such as heating, degreasing, sintering, heat preservation, cooling and oxygen introduction, etc. The parameters are interrelated and influenced, and an error or deviation of one parameter will cause the failure of sintering. If the degreasing speed is too high, it will easily cause the binder in the biscuit to volatilize violently, expand and overflow, and cause the biscuit to break or crack inside. Once fracture or internal crack is formed, the subsequent sintering process will be seriously affected, resulting in a serious decrease in sintering density, and the phenomena of sintering crack and shrinkage fracture are difficult to avoid. However, the slow heating rate of degreasing will prolong the sintering period, reduce the sintering efficiency and increase the manufacturing cost. If the degreasing temperature is too low, it will not be completely degreased, and the residue of any binder will seriously affect the subsequent sintering process. The continued volatilization of the residual binder will induce cracks in the biscuit. However, if the degreasing temperature is too high, it will lead to premature pre-sintering and greatly reduce the sintering activity of the biscuit. Usually, AZO target ceramics are difficult to sinter, and the driving force of sintering is reduced, which makes it difficult to achieve complete densification in the final sintering process.

In some embodiments, the biscuit is first heated to 400-600° C. at a heating rate of 15-25° C./h in an air atmosphere and held at a constant temperature of 2-8 h to degrease the biscuit; immediately afterwards, oxygen is directly introduced to switch the sintering furnace atmosphere to a micro-positive oxygen atmosphere, and the temperature is rapidly increased to 1000° C. and held for 1-5 h, then the furnace temperature is increased to 1400-1500° C. at a heating rate of 50-150° C./h and held for 1-2 h, then the temperature is lowered to 1200-1300° C. and held for 2-8 h. Then stop supplying oxygen, cool it to 200° C. at the rate of 25-50° C./h, and finally cool it naturally to room temperature to obtain aluminum-doped zinc oxide target.

As a preferred embodiment, the degreasing temperature rise rate is set between 15-25° C./h, and in a more preferred embodiment, it is set between 10-20° C./h.

In some embodiments, the maximum temperature of degreasing is set between 400-600° C.

In other embodiments, the maximum degreasing temperature is set between 500-600° C.

In the short-flow sintering process of aluminum-doped zinc oxide target disclosed in the invention, the degreasing-sintering rate is not the most important factor, and rapid heating can be selected. The heating rate is 50-150° C./h, and the optimal heating rate is 60-120° C./h, and the optimal heating rate is 80-100° C./h. Similarly, the appropriate cooling rate was selected after sintering, 25-50° C./h was optimized, and the rate of 30-40° C./h was optimized to cool to 200° C., and finally to room temperature naturally.

The open implementation example of the invention shows that the maximum sintering temperature and holding time have more important influence on the sintering effect. The increase of sintering temperature can improve the sintering density, but it will accelerate the volatilization of the target. Because AZO is a very volatile material, the reprecipitation of zinc oxide will seriously affect the internal structure of AZO target, and then have a serious impact on the subsequent magnetron sputtering coating process. Sintering temperature is very sensitive to the density and microstructure of the target. A slightly lower temperature will cause under-sintering and insufficient sintering density. The porosity also has a fatal impact on the subsequent sputtering coating. The holding time at the highest temperature also has a similar effect. The holding time is too short to reach the density. Insulation time is too long, easy to burn, coarse grain, target embrittlement seriously, subsequent back target welding and sputtering coating prone to target fracture phenomenon. At the same time, because AZO is very easy to volatilize and decompose, the existence of oxygen in the sintering process has become inevitable. This process overcomes the obstacles of high pressure and high flow of oxygen. The oxygen operation under micro pressure can not only obtain high quality AZO target, but also operate safely and avoid various risks of high pressure and high temperature oxygen.

In some preferred embodiments, the maximum sintering temperature is set between 1400-1500° C.

In other embodiments, the maximum sintering temperature is set between 1400-1450° C.

In some preferred embodiments, the lower sintering holding time is set between 2-8 hours, more preferably between 5-8 hours, and still more preferably between 6-7 hours.

In some embodiments, the oxygen flow rate in the sintering process is preferably set between 1-5 L/min, and in more preferred embodiments, the oxygen flow rate is set between 1-3 L/min. The low oxygen flow rate in sintering process makes it difficult to inhibit the decomposition of AZO, and the high oxygen flow rate will increase the operating pressure of process equipment, waste expensive gas and increase production cost.

In the temperature-changing rapid sintering process of aluminum-doped zinc oxide target disclosed by the invention, the temperature change of the integrated degreasing-sintering process can include a plurality of stages. For example, in the degreasing-sintering process, heating intervals of a plurality of stages can be set before the highest degreasing temperature, and different time can be kept in different heating intervals, so as to achieve a more ideal degreasing effect; For example, during the degreasing-sintering process, multiple stages of heating intervals can be set between the highest sintering temperatures, and different heating intervals can be kept for different times, so that the sintering process can achieve more ideal sintering results. Similarly, during the cooling process, different cooling intervals can be set, so as to reasonably control the cooling speed. The multi-stage control setting of the temperature change process is beneficial to control the grain size in the zinc-aluminum oxide and the density and strength of the target.

The aluminum-doped zinc oxide target short-process sintering process disclosed by the invention adopts an integrated degreasing and sintering process, so that the sintering time is greatly shortened, and the whole sintering process from degreasing to sintering and cooling can be completed in only 4 days. The rapid activation sintering was realized, and the grain growth was inhibited. The grain size of the fired AZO target was fine and uniform, and the average grain size was 4-6 μm; High density, relative density up to 99.8%, high strength performance, bending strength ≥150 MPa, and reduced resistivity up to $2.70 \times 10^{-3}$ Ω·cm.

In the invention, the plaster mold is sprayed with a small amount of water before use, and the amount of water is the conventional addition amount in the field.

Embodiment 1

Figure 2:
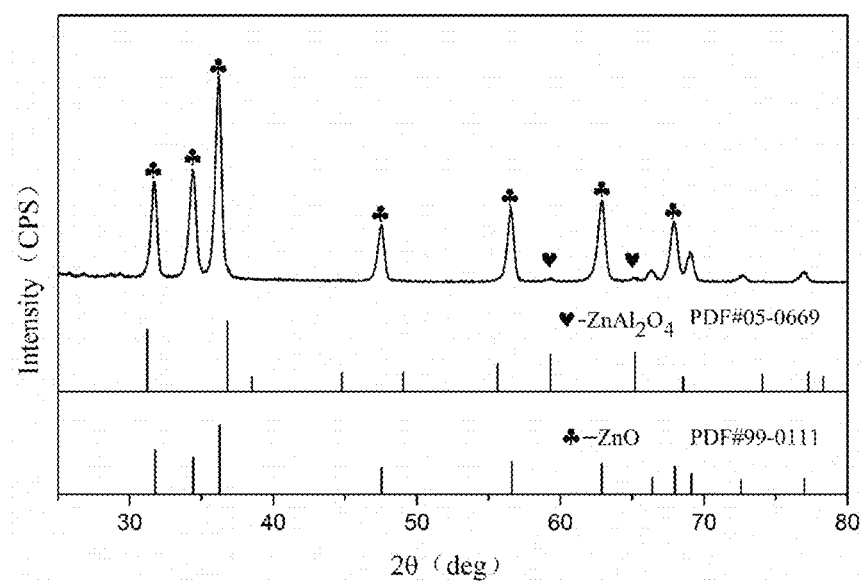
FIG. 2 is an XRD diagram of the aluminum-doped zinc oxide target (AZO target) prepared in embodiment 1.

5000 g mixed powder of alumina and zinc oxide is prepared, of which alumina powder accounts for about 2 wt % of the total mass of the mixed powder, the rest is zinc oxide powder, pre-treatment is carried out by an airflow crushing method, airflow impact pressure is 3 MPa, to obtain particle shape optimization and uniform mixed powder. 3000 g of ionized water, 12000 g of zirconia ball and 50 g of dispersant ammonium polyacrylate are added, and moreover 100 g mixture of binder polyvinyl alcohol and polyethylene glycol (mass ratio of polyvinyl alcohol and polyethylene glycol is 1:1) is added, the mixture is mixed with high-energy ball milling for 1 h, a rotating speed is 1800 r/min, a ball-to-material ratio is 10:1, and milling ball size is 0.3 mm. After ball milling, the slurry is filtered out and added with a defoaming agent. The solid content of mixed powder in the slurry is 80%, the viscosity of the slurry is 1200 mPa·s, and the pH value is 8. When there is no bubble in the slurry, it is slowly injected into the gypsum mold for molding. The grouting pressure of the slurry for casting molding is 0.4 MPa, and the pressure maintaining time of grouting is 600 min. Before using the gypsum mold, it is sprayed with a small amount of water to avoid the defects of biscuit caused by too fast water absorption. The dried and formed biscuit is placed in an integrated degreasing and sintering furnace, and is first heated to 500° C. at a heating rate of 25° C./h in an air atmosphere, the heating rate is 20° C./h, and the highest temperature is kept for 6 h, so as to degrease the biscuit. After degreasing, oxygen is directly switched in at a flow rate of 5 L/min, which is rapidly heated to 1000° C. for 3 h, then the furnace temperature is raised to 1480° C. at a heating rate of 15° C./h, the maximum temperature is kept for 2 h, and then cooled to 1220° C. for 6 h, then the oxygen supply is stopped, and the temperature is reduced to 200° C. at a rate of 50° C./h. The sintered sample with a relative density of 99.8% can be obtained by cooling to 200° C. at the rate of 50° C./h and then naturally cooling to room temperature. The AZO target with the size of 300×270×10 mm can be obtained after processing, grinding and polishing the sintered sample. The bending strength of AZO target is 300 MPa, the average grain size is 3.98 μm, and the resistivity is 3.08×10$^{-3}$ Ω·cm. SEM diagram of AZO target prepared in this example is shown in FIG. 1, and XRD diagram of AZO target is shown in FIG. 2. it can be seen from FIG. 2 that the phase composition of AZO target is mainly ZnO and a small amount of ZnAl$_2$O$_4$ secondary phase.

Embodiment 2

5000 g of mixed powder of alumina and zinc oxide (in which alumina accounts for about 5 wt % of the total mass of the mixed powder) is prepared and then pretreated by an airflow crushing method, the impact pressure of airflow is 2 MPa, 4000 g of deionized water, 12000 g of zirconia balls, 40 g of dispersant ammonium polyacrylate, and 120 g of binder mixture of polyvinyl alcohol and polyethylene glycol are added, and the mixture is mixed and ball-milled at high energy for 1 h at a rotating speed of 3200 r/min. The ratio of ball-to-material is 8:1, and the size of grinding ball is 1.3 mm. After ball milling, the slurry is filtered out and added with a defoamer. The solid content of mixed powder in the slurry is 60%, the viscosity of the slurry is 700 mPa·s, and the pH value is 7.6. When there is no bubble in the slurry, the slurry is slowly injected into a gypsum mold for molding, the grouting pressure is 0.1 MPa, and the pressure holding time is 500 min. Before using the gypsum mold, a small amount of water is sprayed in advance to avoid causing a biscuit due to too fast water absorption. The dried and formed biscuit is placed in an integrated degreasing and sintering furnace, firstly heated to 550° C. at a heating rate of 20° C./h in an air atmosphere, and the heating rate is 20° C./h, and the highest temperature is kept for 8 h, so as to degrease the biscuit. After degreasing, directly switch in oxygen with a flow rate of 4 L/min, and quickly raise the temperature to 1000° C. for 3 hours, then raise the furnace temperature to 1400° C. at a heating rate of 70° C./h, and keep the temperature at the highest temperature for 2 hours, then lower the temperature to 1300° C., keep the temperature for 8 hours, then stop supplying oxygen, reduce the temperature to 200° C. at a rate of 30° C./h, and finally naturally cool to room temperature to obtain a sintered sample with relative density of 99.9%. The AZO target with a size of 300×270×10 mm can be obtained after processing, grinding and polishing the sintered sample. The AZO target prepared in this example is mainly composed of ZnO and a small amount of ZnAl$_2$O$_4$ secondary phase. The bending strength of the AZO target is 330 MPa, the average grain size is 4.55 μm, and the resistivity is 2.87×10$^{-3}$ Ω·cm.

Embodiment 3

5000 g of mixed powder of zinc oxide and aluminum oxide (in which the aluminum oxide accounts for about 2.5 wt % of the total mass of the mixed powder) is prepared and then pretreated by adopting a method of airflow crushing. The airflow impact pressure is 2 MP, 2500 g of deionized water, 12000 g of zirconia balls, 50 g of dispersant ammonium polyacrylate and 125 g of mixture of polyvinyl alcohol and polyethylene glycol are added, and the mixture is mixed and ball milled at high energy for 1 h, the rotating speed is 1400 r/min, the ball-to-material ratio is 2:1, and the ball size is 1.6 mm. After ball milling, the slurry is filtered out and added with a defoamer. The solid content of mixed powder in the slurry is 60%, the viscosity of the slurry is 300 mPa·s, and the pH value is 7.4. When there is no bubble in the slurry, it is slowly injected into the gypsum mold for molding, the grouting pressure is 0.2 MPa, and the pressure holding time is 800 min. Before using the gypsum mold, a small amount of water is sprayed in advance to avoid the biscuit caused by too fast water absorption. The dried and formed biscuit is placed in an integrated degreasing and sintering furnace, and heated to 500° C. at a heating rate of 15° C./h and 20° C./h in an air atmosphere, and the biscuit is degreased for 5 hours. After degreasing, directly switch in oxygen with a flow rate of 2 L/min, and quickly heat up to 1000° C. for 1 hour, then raise the furnace temperature to 1450° C. with a heating rate of 120° C./h, and keep the temperature at the highest temperature for 2 hours, then cool down to 1200° C., keep the temperature for 6 hours, then stop supplying oxygen, reduce the temperature to 200° C. at a rate of 25° C./h, and finally naturally cool to room temperature to obtain a sintered sample with a relative density of 99.8%. The AZO target with a size of 300×270× 10 mm can be obtained after processing, grinding and polishing the sintered sample. The bending strength of AZO target is 330 MPa, the average grain size is 4.68 μm, and the resistivity is 2.81×10$^{-3}$ Ω·cm.

Embodiment 4

5000 g of mixed powder of zinc oxide and aluminum oxide (in which aluminum oxide accounts for 2.5 wt % of the total mass of the mixed powder) is prepared and then pretreated by an airflow crushing method, with the airflow impact pressure of 4 MP, 2500 g of deionized water, 12000 g of zirconia balls, 50 g of dispersant ammonium polyacrylate, and 125 g of binder mixture of polyvinyl alcohol and polyethylene glycol are added, and the mixture is mixed and ball-milled for 0.5 h at a rotating speed of 2500 r/min with a ball-to-material ratio. After ball milling, the slurry is filtered out and added with a defoaming agent. The solid content of mixed powder in the slurry is 65%, the viscosity of the slurry is 500 mPa·s, and the pH value is 8.2. When there is no bubble in the slurry, the slurry is slowly injected into the gypsum mold for molding, the grouting pressure is 0.3 MPa, and the holding time is 600 min. Before using the gypsum mold, a small amount of water is used to spray it wet in advance, so as to avoid the defects of biscuit caused by too fast water absorption. The dried and formed biscuit is placed in an integrated degreasing and sintering furnace, and is first heated to 500° C. at a heating rate of 20° C./h and a heating rate of 18° C./h in an air atmosphere, and the biscuit is degreased for 5 hours. After degreasing, directly switch in oxygen at a flow rate of 1 L/min, heat up to 1000° C. for 1 h at a rate of 120° C./h, then raise the furnace temperature to 1450° C. at a rate of 100° C./h, keep the highest temperature for 2 h, then cool down to 1200° C., keep the temperature for 6 h, then stop supplying oxygen and cool down to 200° C. at a rate of 35° C./h. Finally, naturally cooling to room temperature to obtain a sintered sample with relative density of 99.8%. The AZO target with a size of 300×270×10 mm can be obtained after processing, grinding and polishing the sintered sample. The bending strength of AZO target is 350 MPa, the average grain size is 4.75 μm, and the resistivity is $2.70 \times 10^{-3}$ Ω·cm.

Embodiment 5

5000 g of mixture of zinc oxide and alumina powder (of which alumina accounts for about 2.5 wt % of the total mass of the mixed powder) is prepared and then pretreated by an air flow crushing method. The air flow impact pressure is 4 MP, 2500 g of deionized water and 12000 g of zirconia ball, 50 g of dispersant ammonium polyacrylate and 125 g of mixture of binder polyvinyl alcohol and polyethylene glycol are added, the mixture then is mixed and high-energy ball milled for 0.8 h. The rotating speed is 2800 r/min, the ball material ratio is 6:1, and the grinding ball size is 0.5 mm. After ball milling, the slurry is filtered out and add with a defoamer. The solid content of the mixed powder in the slurry is 60%, the slurry viscosity is 300 mPa·s, and the pH value is 7.8. When the slurry has no bubble, slowly inject it into the gypsum mold for molding. The grouting pressure is 0.3 MPa, and the pressure holding time is 780 min. Before using the plaster mould, spray it with a small amount of water in advance to avoid the defects of biscuit caused by too fast water absorption. Place the dry formed biscuit in the degreasing and sintering integrated furnace. Firstly, heat it to 550° C. at the heating rate of 25° C./h in air atmosphere, the heating rate is 18° C./h, and keep it warm for 4 h to degrease the biscuit. After degreasing, directly switch to oxygen with oxygen flow of 1l/min, raise the temperature to 1000° C. at the rate of 120° C./h for 1 h, then raise the furnace temperature to 1450° C. at the rate of 100° C./h for 2 h, then lower the temperature to 1200° C. for 8 h, then stop supplying oxygen, lower the temperature to 200° C. at the rate of 25° C./h, and finally cool naturally to room temperature, the sintered sample with relative density of 99.7% can be obtained. After processing, grinding and polishing, the sintered sample can be obtained with a size of 300×270×10 mm AZO target. The bending strength of AZO target is 335 mpa and the average grain size is 4.36 μm. The resistivity is $2.75 \times 10^{-3}$ Ω·cm.

Embodiment 6

5000 g of mixed powder of zinc oxide and aluminum oxide (in which the aluminum oxide accounts for about 4 wt % of the total mass of the mixed powder) is prepared and then pretreated by adopting an airflow crushing method, the airflow impact pressure is 4 MP, 2500 g of deionized water, 12000 g of zirconia balls, 50 g of dispersant ammonium polyacrylate and 125 g of binder mixture of polyvinyl alcohol and polyethylene glycol are added, and the mixture is mixed and ball milled for 0.8 h at a rotating speed of 2800 r/min. The ratio of ball-to-material is 6:1, the size of grinding ball is 0.5 mm. After ball milling, the slurry is filtered out and added with a defoaming agent. The solid content of the mixed powder in the slurry is 60%, the viscosity of the slurry is 300 mPa·s, and the pH value is 8.6. When there is no bubble in the slurry, it is slowly injected into the gypsum mold for molding. The grouting pressure is 0.3 MPa, and the pressure holding time is 310 min. Before using the gypsum mold, a small amount of water is sprayed in advance, so as to avoid the biscuit caused by too fast water absorption. The dried and formed biscuit is placed in an integrated degreasing and sintering furnace, and heated to 400° C. at a heating rate of 15° C./h and 18° C./h in an air atmosphere, and the biscuit is degreased for 8 hours. After degreasing, oxygen is directly switched in at a flow rate of 3 L/min, heated to 1000° C. at a rate of 120° C./h and kept for 3 h, then the furnace temperature is raised to 1400° C. at a rate of 120° C./h, kept for 2 h, then cooled to 1200° C., kept for 8 h, then stopped supplying oxygen and cooled to 200° C. at a rate of 30° C./h. Finally, the sintered sample with relative density of 99.7% can be obtained by natural cooling to room temperature, the AZO target with a size of 300×270×10 mm can be obtained after processing, grinding and polishing the sintered sample. The flexural strength of AZO target is 325 MPa, the average grain size is 4.15 μm, and the resistivity is $2.78 \times 10^{-3}$ Ω·cm.

Comparative Example 1

Figure 3:
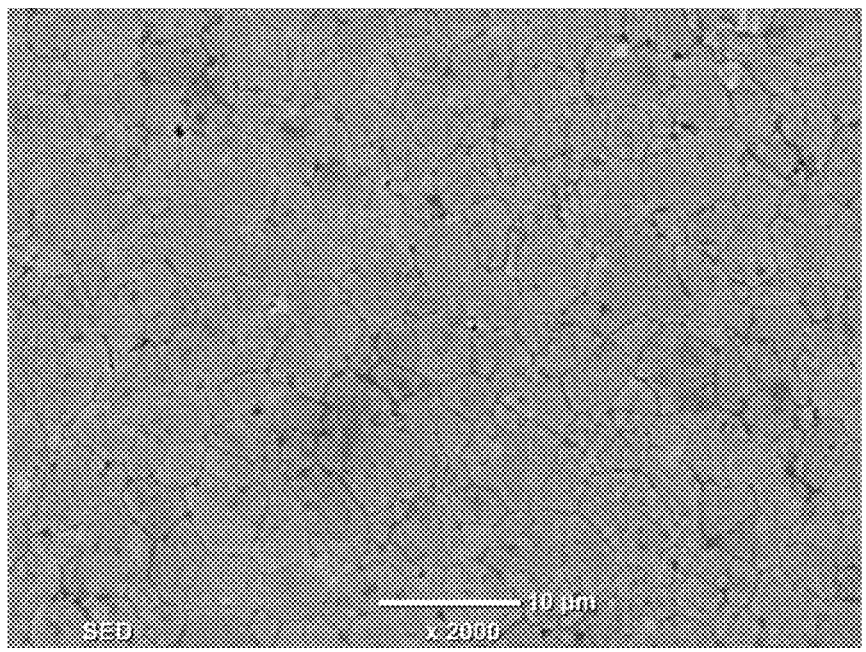
FIG. 3 is a SEM image of grain morphology of an aluminum-doped zinc oxide target (AZO target) prepared in comparative example 1.

1000 g of mixed powder of zinc oxide and alumina is prepared, in which alumina accounts for about 3 wt % of the mass of the mixed powder. 1500 g deionized water and 2400 g zirconia ball are added, 1.0 g ammonium polyacrylate and 5.0 g polyvinyl alcohol are added, and then ball milled for 60H. After ball milling, the slurry is filtered out, 1.0 g glycerol polyoxypropylene ether is added for degassing and defoaming. When the slurry has no bubble, it is slowly injected into the gypsum mold for molding. Before using the gypsum mold, spray a small amount of water in advance to avoid the defects of the biscuit caused by too-fast water absorption. Dry the formed biscuit at room temperature of 28° C. for 2 days. Then put the biscuit into the drying oven and dry it at 50° C. for 8 h. Finally, put the dried biscuit into the degreasing furnace for degreasing. The degreasing temperature is 500° C., the heating rate is 15° C./h, and the maximum temperature is kept for 5 h. The degreased biscuit is sintered. Under the sintering atmosphere of air, the maximum sintering temperature is 1320° C., and the maximum temperature is kept for 3.5 h. Finally, the sintered sample with relative density of 98.8% is obtained. After processing, grinding and polishing, the sintered sample can be obtained with a size of 300×270×10 mm AZO target. The SEM diagram of grain morphology of aluminum-doped zinc oxide target (AZO target) prepared in proportion 1 is shown in FIG. 3. The bending strength of AZO target is 125 MPa and the average grain size is 3.87 μm. The resistivity is $3.1 \times 10^{-3}$ Ω·cm.

Comparative Example 2

Figure 4:
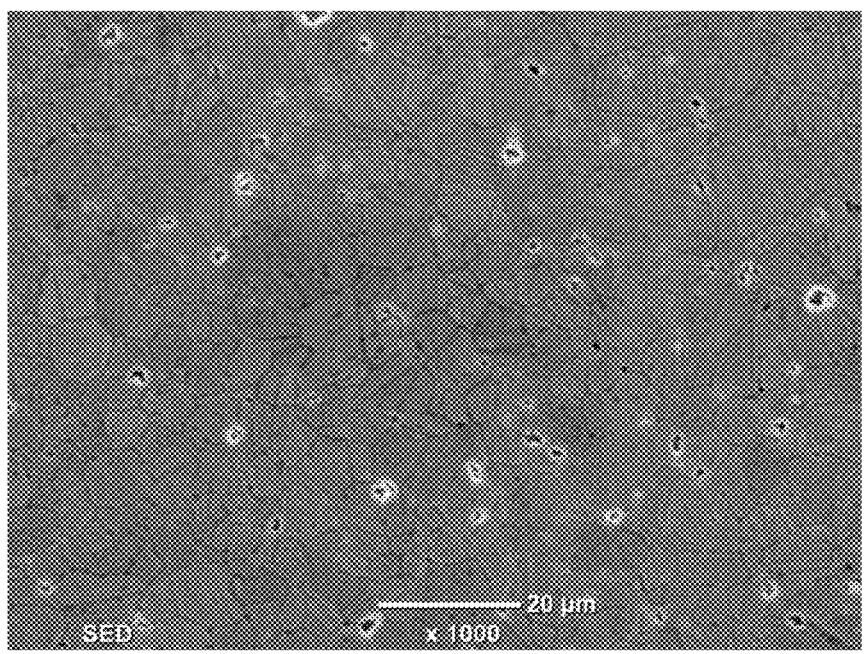
FIG. 4 is a SEM image of grain morphology of an aluminum-doped zinc oxide target (AZO target) prepared in comparative example 2.

P1000 g of mixed powder of zinc oxide and alumina is prepared, in which alumina accounts for about 1 wt % of the mass of the mixed powder. 1000 g deionized water and 2400 g zirconia ball are added, 15 g ammonium polyacrylate and 15 g binder polyvinyl alcohol are added, mixed and ball milled for 48 h. After ball milling, the slurry is filtered out and 3.0 g glycerol polyoxypropylene ether is added for defoaming and degassing. When the slurry has no bubble, it is slowly injected into the gypsum mold for forming. Before using the plaster mold, spray it with a small amount of water in advance to avoid the defects of the biscuit caused by the rapid absorption of water. Dry the molded biscuit at room temperature 20° C. for 4 days. Then put the biscuit into a drying oven and dry it at 70° C. for 4 h, and finally put the dried biscuit into a degreasing furnace for degreasing at 600° C., with a heating rate of 25° C./h and a maximum temperature of 2 h. The degreased biscuit was sintered in air at a maximum sintering temperature of 1400° C. for 8 h, and finally the sintered sample with a relative density of 99.2% is obtained. The AZO target with a size of 300×270×10 mm can be obtained after processing, grinding and polishing the sintered sample. SEM image of grain morphology of the aluminum-doped zinc oxide target (AZO target) prepared in Comparative example 2 is shown in FIG. 4. The bending strength of AZO target is 95 MPa, the average grain size is 4.23 μm, and the resistivity is $2.84 \times 10^{-3}$ Ω·cm.

Comparative Example 3

Figure 5:
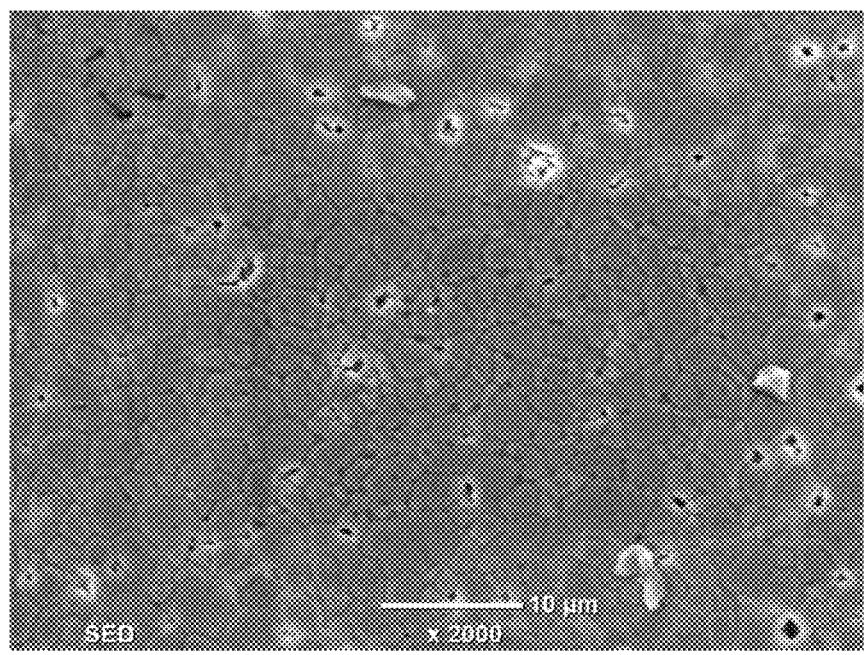
FIG. 5 is a SEM image of grain morphology of an aluminum-doped zinc oxide target (AZO target) prepared in comparative example 3.

1500 g of mixed powder of zinc oxide and alumina is prepared, in which alumina accounts for about 5 wt % of the mass of the mixed powder. 450 g of deionized water and 3600 g of zirconia ball are added, 37.5 g of ammonium polyacrylate and 45 g of binder polymethacrylate are added, and the mixture is ball milled for 30 h. After ball milling, the slurry is filtered out and 9.0 g of glycerol polyoxypropylene ether is added for defoaming and degassing. When the slurry has no bubble, it shall be slowly injected into the gypsum mold for molding. Before using the gypsum mold, it shall be sprayed with a small amount of water in advance to avoid the defects of the biscuit caused by too fast water absorption. The formed biscuit shall be dried at room temperature 30° C. for 3 days. Then put the biscuit into the drying oven and dry it at 120° C. for 2 h. Finally, put the dried biscuit into the degreasing furnace for degreasing. The degreasing temperature is 600° C., the heating rate is 15° C./h, and the maximum temperature is kept for 10 h. The degreased biscuit is sintered. Under the sintering atmosphere of air, the maximum sintering temperature is 1200° C., and the maximum temperature is kept for 8 h. Finally, the sintered sample with relative density of 98.2% is obtained. After processing, grinding and polishing, the sintered sample can be obtained with a size of 300×270×10 mm AZO target. SEM image of grain morphology of the aluminum-doped zinc oxide target (AZO target) prepared in Comparative example 3 is shown in FIG. 5. The bending strength of AZO target is 140 MPa, the average grain size is 2.97 μm, and the resistivity is $3.42 \times 10^{-3}$ Ω·cm.

Comparative Example 4

1500 g of mixed powder of zinc oxide and alumina is prepared, in which alumina accounts for about 1 wt % of the total mixed powder, 675 g of deionized water and 3600 g of zirconia ball are added, 27.0 g of ammonium polyacrylate and 37.5 g of binder polyvinyl alcohol are added, mixed and high-energy ball milled for 2 h, the slurry is filtered out after ball milling, and 9.0 g of glycerin polyoxypropylene ether is added for defoaming and degassing. When the slurry has no bubble, it shall be slowly injected into the gypsum mold for molding, and the dried biscuit shall be placed in the degreasing furnace for degreasing. The degreasing temperature is 500° C., the heating rate is 15° C./h, and the maximum temperature shall be kept for 15 h. The degreased biscuit is directly integrated sintered. Under the sintering atmosphere of air, the maximum sintering temperature is 1500° C., and the maximum temperature is kept for 2 h. Finally, the sintered sample with a relative density of 98.8% is obtained. After processing, grinding and polishing, the sintered sample can be obtained with a size of 300×270×10 mm AZO target. The bending strength of AZO target is 123 MPa and the average grain size is 4.85 μm. The resistivity is $2.38 \times 10^{-3}$ Ω·cm.

Comparative Example 5

1500 g of mixed powder of zinc oxide and alumina is prepared, in which alumina accounts for about 3 wt % of the total mixed powder, 720 g of deionized water, 3600 g of zirconia ball, 22.5 g of ammonium polyacrylate and 30.0 g of binder polyvinyl alcohol are added, mixed and ball milled for 1 h, the slurry is filtered out after ball milling, and 10.0 g of glycerol polyoxypropylene ether is added for defoaming and degassing. When the slurry has no bubble, it shall be slowly injected into the gypsum mold for molding. Before the gypsum mold is used, it shall be sprayed with a small amount of water in advance to avoid biscuit defects caused by too fast water absorption. The dried biscuit shall be placed in the degreasing furnace for degreasing. The degreasing temperature is 450° C., the heating rate is 25° C./h, and the maximum temperature shall be kept for 10 h. The degreased biscuit is directly integrated sintered. Under the sintering atmosphere of air, the maximum sintering temperature is 1350° C., and the maximum temperature is kept for 4 h. Finally, the sintered sample with a relative density of 99.4% is obtained. After processing, grinding and polishing, the sintered sample can be obtained with a size of 300×270×10 mm AZO target. The bending strength of AZO target is 113 MPa and the average grain size is 3.96 μm. The resistivity is $2.97 \times 10^{-3}$ Ω·cm.

Comparative Example 6

1500 g of mixed powder of zinc oxide and alumina is prepared, in which alumina accounts for about 5 wt % of the total mixed powder, 1200 g of deionized water, 3600 g of zirconia ball, 4.5 g of ammonium polyacrylate and 30.0 g of binder polyvinyl alcohol are added, mixed and ball milled for 0.5 h. After ball milling, the slurry is filtered out and 4.0 g of glycerol polyoxypropylene ether is added for defoaming and degassing. When the slurry has no bubble, it shall be slowly injected into the gypsum mold for molding. Before the gypsum mold is used, it shall be sprayed with a small amount of water in advance to avoid the defect of biscuit caused by too fast water absorption. The formed biscuit shall be dried at room temperature 38° C. for 2 days. Then put the biscuit into the drying oven and dry it at 60° C. for 5 hours. Finally, put the dried biscuit into the degreasing furnace for degreasing. The degreasing temperature is 400° C., the heating rate is 25° C./h, and the maximum temperature is kept for 10 hours. The degreased biscuit is directly integrated sintered. Under the sintering atmosphere of air, the maximum sintering temperature is 1320° C., and the maximum temperature is kept for 5 h. Finally, the sintered sample with a relative density of 97.8% can be obtained. The AZO target with the size of 300×270×10 mm can be obtained after processing, grinding and polishing the sintered sample. The bending strength of AZO target is 100 MPa, the average grain size is 3.92 μm, and the resistivity is $3.1 \times 10^{-2}$ Ω·cm.

Comparative Example 7

5000 g mixed powder of alumina and zinc oxide is prepared, of which alumina powder accounts for about 2 wt % of the total mass of the mixed powder, and the rest is zinc oxide powder. 3000 g of deionized water, 12000 g of zirconia ball, 50 g of dispersant ammonium polyacrylate and 100 g of mixture of binder polyvinyl alcohol and polyethylene glycol (the mass ratio of polyvinyl alcohol and polyethylene glycol is 1:1) are added, mixed and high-energy ball milled for 1 h, a rotating speed is 1800 r/min, a ball-to-material ratio is 10:1, and a milling ball size is 0.3 mm. After ball milling, the slurry is filtered out and a defoamer is added. The solid content of the mixed powder in the slurry is 80%, the slurry viscosity is 1200 mPa·s, and the pH value is 8. When the slurry has no bubble, it is slowly injected into the gypsum mold for molding. The grouting pressure for slurry pouring is 0.4 MPa, and the grouting pressure holding time is 600 min, Before using the gypsum mold, spray a small amount of water in advance to avoid the defect of biscuit caused by too fast water absorption. Place the dry formed biscuit in the degreasing sintering integrated furnace. Firstly, heat it to 500° C. at the heating rate of 25° C./h in air atmosphere, the heating rate is 20° C./h, and the maximum temperature is maintained for 6 h to degrease the biscuit. After degreasing, directly switch to oxygen with oxygen flow of 5 L/min, quickly raise the temperature to 1000° C. for 3 h, then raise the furnace temperature to 1480° C. at the heating rate of 15° C./h, keep the maximum temperature for 2 h, lower the temperature to 1220° C. for 6 h, then stop supplying oxygen, lower the temperature to 200° C. at the rate of 50° C./h. Finally, cool naturally to room temperature, the sintered sample with a relative density of 99.8% can be obtained. The AZO target with the size of 300×270×10 mm can be obtained after processing, grinding and polishing the sintered sample. The bending strength of AZO target is 80 MPa, the average grain size is 15 μm, and the resistivity is $15 \times 10^{-3}$ Ω·cm.

Comparative Example 8

5000 g of mixed powder of alumina and zinc oxide is prepared, of which alumina powder accounts for about 2 wt % of the total mass of the mixed powder, and the rest is zinc oxide powder. It is pretreated by an airflow crushing method, and the airflow impact pressure is 3 Mpa to obtain the particle shape optimized and uniform mixed powder. 3000 g of ionized water, 12000 g of zirconia ball and 50 g of dispersant ammonium polyacrylate are added, and moreover 100 g mixture of binder polyvinyl alcohol and polyethylene glycol (mass ratio of polyvinyl alcohol and polyethylene glycol is 1:1) is added, mixed and high-energy ball milled for 1 h, a rotating speed is 1800 r/min, a ball-to-material ratio is 10:1, and a milling ball size is 0.3 mm. After ball milling, the slurry is filtered out and a defoamer is added. The solid content of mixed powder in the slurry is 80%, the slurry viscosity is 1200 mPa·s, and pH value is 8. When the slurry has no bubble, it shall be slowly injected into the gypsum mold for molding. The grouting pressure for slurry pouring and molding is 0.4 MPa and the grouting pressure holding time is 600 min. The gypsum mold shall be sprayed with a small amount of water in advance before use to avoid biscuit defects caused by too fast water absorption. Place the dry formed biscuit in the degreasing sintering integrated furnace. Firstly, heat it to 500° C. at the heating rate of 25° C./h in air atmosphere, the heating rate is 20° C./h, and the maximum temperature is maintained for 6 h to degrease the biscuit. After degreasing, directly switch to oxygen with oxygen flow of 15 L/min, quickly raise the temperature to 1000° C. for 3 h, then raise the furnace temperature to 1480° C. at the heating rate of 15° C./h, keep the maximum temperature for 2 h, lower the temperature to 1220° C. for 6 h, then stop supplying oxygen, lower the temperature to 200° C. at the rate of 50° C./h, and finally cool naturally to room temperature, the sintered sample with a relative density of 99.8% can be obtained. The AZO target with the size of 300×270×10 mm can be obtained after processing, grinding and polishing the sintered sample. The bending strength of AZO target is 82 MPa, the average grain size is 16 μm, and the resistivity is $14 \times 10-3$ Ω·cm.

It can be seen from the embodiments and comparative examples that the AZO target prepared by the invention has fine and uniform grains and excellent performance.

The above embodiments only describe the preferred mode of the invention, but do not limit the scope of the invention. On the premise of not departing from the design spirit of the invention, various modifications and improvements made by ordinary technicians in the field to the technical scheme of the invention shall fall within the protection scope determined by the claims of the invention.

What is claimed is:
1. A variable-temperature and fast-sintering process of an aluminum-doped zinc oxide target material, comprising:
carrying out integrated degreasing and sintering processes on an aluminum-doped zinc oxide biscuit;
wherein the degreasing process is carried out in an air atmosphere, and a resultant aluminum-doped zinc oxide target material is prepared by a temperature-changing treatment in the sintering process under a condition of circulating controllable mixed atmosphere;
wherein the mixed atmosphere is air and oxygen, a volume ratio of the air in the mixed atmosphere is 20%-40%, and a volume ratio of the oxygen is 60%-80%;
wherein a process of the temperature-changing treatment comprises: introducing the oxygen after the degreasing to form the mixed atmosphere of air and oxygen, heating to 1000-1100° C. and then keeping the temperature for 1-5 h; subsequently according to a predetermined sintering temperature curve, firstly heating to a highest sintering temperature $T_1$, keeping the temperature at $T_1$ for a predetermined time then reducing to a lower temperature $T_2$, and keeping the temperature at $T_2$ for a certain time; and afterwards, stop supplying the oxygen, and cooling down to thereby obtain the resultant aluminum-doped zinc oxide target material.

2. The variable-temperature and fast-sintering process of an aluminum-doped zinc oxide target material according to claim 1, wherein the sintering process is carried out under atmospheric pressure.

3. The variable-temperature and fast-sintering process of an aluminum-doped zinc oxide target material according to claim 1, wherein the degreasing process is to heat to 400-600° C. at a heating rate of 15-25° C./h and then keep the temperature constant for 2-8 hours, for degreasing the biscuit.

4. The variable-temperature and fast-sintering process of an aluminum-doped zinc oxide target material according to claim 1, wherein a heating rate for the heating to the highest sintering temperature $T_1$ is 50-150° C./h, the highest sintering temperature $T_1$ is 1400-1500° C., the predetermined time for keeping the temperature at $T_1$ is 1-2 hours, the lower temperature $T_2$ is 1200-1300° C., and the certain time for keeping the temperature at $T_2$ is 2-8 hours; and a process of the cooling down is to cool to 200° C. at a rate of 25-50° C./h and then naturally cool to room temperature.

5. The variable-temperature and fast-sintering process of an aluminum-doped zinc oxide target material according to claim 1, wherein a flow rate of the oxygen is 1-5 L/min.

6. The variable-temperature and fast-sintering process of an aluminum-doped zinc oxide target material according to claim 1, further comprising: preparing the aluminum-doped zinc oxide biscuit by a grouting method, wherein the grouting method specifically comprises:

(1) mixing zinc oxide powder and alumina powder to obtain mixed powder;
(2) adding deionized water, a molding agent, a dispersant and a defoamer into the mixed powder and mixing evenly, and performing high-energy ball milling to prepare mixed slurry; and
(3) injecting the mixed slurry into a mold for forming, standing, demoulding and drying to thereby prepare the aluminum-doped zinc oxide biscuit.

7. The variable-temperature and fast-sintering process of an aluminum-doped zinc oxide target material according to claim 6, wherein after mixing zinc oxide powder and alumina powder, a pretreatment process is performed on the zinc oxide powder and the alumina powder.

8. The variable-temperature and fast-sintering process of an aluminum-doped zinc oxide target material according to claim 7, wherein the pretreatment process is to pretreat the mixed powder by an air flow crushing method, and an air flow impact pressure is 1-4 MPa.

9. The variable-temperature and fast-sintering process of an aluminum-doped zinc oxide target material according to claim 6, wherein a rotating speed during performing high-energy ball milling is 1400-3200 r/min, a ball-to-material ratio is 10:1-2:1, a size of a milling ball is 0.3-1.6 mm, and a mixing time of ball milling is 0.5-1.5 hours.

* * * * *